United States Patent
Joshi et al.

(10) Patent No.: US 7,187,079 B2
(45) Date of Patent: Mar. 6, 2007

(54) STACKED MEMORY CELL HAVING DIFFUSION BARRIERS

(75) Inventors: Vikram Joshi, Colorado Springs, CO (US); Narayan Solayappan, Colorado Springs, CO (US); Carlos A. Paz de Araujo, Colorado Springs, CO (US); Larry D. McMillan, Colorado Springs, CO (US)

(73) Assignee: Symetrix Corporation, Colorado Springs, CO (US)

(*) Notice: Subject to any disclaimer, the term of this patent is extended or adjusted under 35 U.S.C. 154(b) by 374 days.

(21) Appl. No.: 10/666,381

(22) Filed: Sep. 19, 2003

(65) Prior Publication Data

US 2004/0046198 A1 Mar. 11, 2004

Related U.S. Application Data

(60) Division of application No. 10/348,706, filed on Jan. 22, 2003, now Pat. No. 6,743,643, which is a continuation-in-part of application No. 10/302,441, filed on Nov. 22, 2002, now Pat. No. 6,815,223, and a continuation-in-part of application No. 10/302,442, filed on Nov. 22, 2002, now abandoned, and a continuation-in-part of application No. 09/998,469, filed on Nov. 29, 2001, now Pat. No. 6,781,184.

(51) Int. Cl.
*H01L 23/48* (2006.01)
(52) U.S. Cl. ............ 257/751; 257/767; 257/295; 257/296; 257/300
(58) Field of Classification Search ........ 257/751, 257/767, 295, 296, 300; 438/3, 240, 627, 438/643, 653
See application file for complete search history.

(56) References Cited

U.S. PATENT DOCUMENTS

| | | | |
|---|---|---|---|
| 5,046,043 A | 9/1991 | Miller et al. | |
| 5,122,923 A | 6/1992 | Matsubara et al. | |
| 5,416,359 A * | 5/1995 | Oda | 257/751 |
| 5,434,102 A | 7/1995 | Watanabe et al. | |
| 5,468,684 A | 11/1995 | Yoshimori et al. | |
| 5,508,226 A | 4/1996 | Ito et al. | |

(Continued)

FOREIGN PATENT DOCUMENTS

WO    WO 01/75945 A2    10/2002

OTHER PUBLICATIONS

Koyama et al., "A Stacked Capacitor With (BaxSr1-x)TiO3 For 256M DRAM", IEEE, 1991, pp. 823-826.

*Primary Examiner*—Eugene Lee
(74) *Attorney, Agent, or Firm*—Patton Boggs LLP

(57) ABSTRACT

A nonconductive hydrogen barrier layer is deposited on a substrate and completely covers the surface area over a memory capacitor and a MOSFET switch of an integrated circuit memory cell. A portion of an insulator layer adjacent to the bottom electrode of a memory capacitor is removed by etching to form a moat region. A nonconductive oxygen barrier layer is deposited to cover the sidewall and bottom of the moat. The nonconductive oxygen barrier layer and a conductive diffusion barrier beneath the capacitor together provide a substantially continuous diffusion barrier between the capacitor and a switch. Also, the nonconductive hydrogen barrier layer, the nonconductive oxygen barrier, and the conductive diffusion barrier substantially completely envelop the capacitor, in particular a ferroelectric thin film in the capacitor.

6 Claims, 7 Drawing Sheets

U.S. PATENT DOCUMENTS

| | | | |
|---|---|---|---|
| 5,519,234 A | 5/1996 | Paz de Araujo et al. | |
| 5,648,114 A | 7/1997 | Paz De Araujo et al. | |
| 5,691,572 A * | 11/1997 | Chung | 257/751 |
| 5,773,314 A | 6/1998 | Jiang et al. | |
| 5,825,057 A | 10/1998 | Watanabe et al. | |
| 5,838,035 A * | 11/1998 | Ramesh | 257/295 |
| 5,962,069 A | 10/1999 | Schindler et al. | |
| 6,130,481 A * | 10/2000 | Harada et al. | 257/740 |
| 6,204,070 B1 | 3/2001 | Kim | |
| 6,225,185 B1 * | 5/2001 | Yamazaki et al. | 438/396 |
| 6,235,542 B1 * | 5/2001 | Yu | 438/3 |
| 6,281,142 B1 * | 8/2001 | Basceri et al. | 438/771 |
| 6,326,315 B1 | 12/2001 | Uchiyama et al. | |
| 6,376,325 B1 * | 4/2002 | Koo | 438/396 |
| 6,613,586 B2 * | 9/2003 | Bailey | 438/3 |
| 2004/0140494 A1 * | 7/2004 | Fishburn | 257/296 |
| 2004/0203176 A1 * | 10/2004 | Zhao et al. | 438/3 |
| 2005/0006680 A1 * | 1/2005 | Song et al. | 257/295 |
| 2005/0019960 A1 * | 1/2005 | Lee et al. | 438/3 |

* cited by examiner

STACKED MEMORY CELL HAVING DIFFUSION BARRIERS

RELATED INVENTIONS

This application is a divisional application of application Ser. No. 10/348,706 filed Jan. 22, 2003 now U.S. Pat. No. 6,743,643, which application is a continuation-in-part application under 37 CFR 1.53(b) of U.S. patent application Ser. No. 10/302,441 filed Nov. 22, 2002 now U.S. Pat. No. 6,815,223, of U.S. patent application Ser. No. 10/302,442 filed Nov. 22, 2002 now abandoned, and of U.S. patent application Ser. No. 09/998,469 filed Nov. 29, 2001 now U.S. Pat. No. 6,781,184.

FIELD OF THE INVENTION

The invention relates in general to the structure and fabrication of integrated circuits and more particularly to an integrated circuit providing effective protection of selected circuit components, such as transistors and ferroelectric materials, against diffusion of oxygen and hydrogen.

BACKGROUND OF THE INVENTION

Ferroelectric compounds possess favorable characteristics for use in nonvolatile integrated circuit memories. See U.S. Pat. No. 5,046,043 issued Sep. 3, 1991 to Miller et al. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$-type ferroelectric oxides such as PZT (lead zirconium titanate) and PLZT (lead lanthanum zirconium titanate) have been studied for practical use in integrated circuits. Layered superlattice material oxides have also been studied for use in integrated circuits. See U.S. Pat. No. 5,434,102 issued Jul. 18, 1995 to Watanabe et al. Layered superlattice materials exhibit characteristics in ferroelectric memories that generally are superior to those of PZT and PLZT compounds. Integrated circuit devices containing ferroelectric elements are currently being manufactured. Nevertheless, problems associated with oxygen degradation and hydrogen degradation during the manufacturing process hinders the economical production in commercial quantities of ferroelectric memories and other IC devices using either the $ABO_3$-type oxides or the layered superlattice material compounds with the desired electronic characteristics.

A typical memory in an integrated circuit contains a semiconductor substrate and a metal-oxide semiconductor field-effect transistor (MOSFET) electrically connected to a capacitor device. Layered superlattice materials and other dielectric capacitor materials currently in use and development comprise metal oxides. In conventional fabrication methods, crystallization of the metal oxides to produce desired electronic properties requires heat treatments in oxygen-containing gas at elevated temperatures. The heating in the presence of oxygen is typically performed at a temperature in a range of 500° C. to 900° C. for 60 minutes to three hours. As a result of the presence of reactive oxygen at elevated temperatures, numerous defects, such as dangling bonds, are generated in the single crystal structure of the semiconductor silicon substrate, leading to deterioration in the electronic characteristics of the MOSFET. Good ferroelectric properties have been achieved in the prior art using process heating temperatures at about 700° C. to crystallize layered superlattice material. See U.S. Pat. No. 5,508,226 issued Apr. 16, 1996 to Ito et al. Nevertheless, the long exposure times for up to several hours in oxygen, even at the somewhat reduced temperature ranges, results in oxygen damage to the semiconductor substrate and other elements of a. CMOS circuit.

After completion of the integrated circuit, the presence of oxides may still cause problems because oxygen atoms from a thin film of metal oxide capacitor dielectric, for example, from ferroelectric layered superlattice material, tend to diffuse through the various materials contained in the integrated circuit and combine with atoms in the integrated circuit substrate and in semiconductor layers forming undesired oxides. The resulting oxides interfere with the function of the integrated circuit; for example, they may act as dielectrics in the semiconducting regions, thereby forming virtual capacitors.

Diffusion of atoms from the underlying semiconductor substrate and other circuit layers into the ferroelectric metal oxide (or other dielectric metal oxide) is also a problem; for example, silicon from a silicon substrate and from polycrystalline silicon contact layers is known to diffuse into layered superlattice material and degrade its ferroelectric properties. For relatively low-density applications, the ferroelectric memory capacitor is placed on the side of the underlying CMOS circuit, and this may reduce somewhat the problem of undesirable diffusion of atoms between circuit elements. Nevertheless, as the market demand and the technological ability to manufacture high-density circuits increase, the distance between circuit elements decreases, and the problem of molecular and atomic diffusion between elements becomes more acute. To achieve high circuit density by reducing circuit area, the capacitor of a memory cell is placed virtually on top of the switch element, typically a field-effect transistor ("MOSFET"), and the switch and bottom electrode of the capacitor are electrically connected by an electrically conductive plug. To inhibit undesired oxygen diffusion, a barrier layer is sometimes disposed under the ferroelectric or other dielectric oxide, between the capacitor's bottom electrode and the underlying layers. The barrier layer must inhibit the diffusion of oxygen and other chemical species that may cause problems; it must also be electrically conductive, to enable electrical connection between the capacitor and the switch. Such barrier layers are typically limited in size to cover only the surface area of an integrated circuit substrate located approximately directly below the capacitor.

To restore the silicon properties of the MOSFET/CMOS, the manufacturing process typically includes a forming-gas, or hydrogen, annealing ("FGA") process, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° C. and 550° C., typically around 400° C. to 450° C. for a time period of about 30 minutes. In addition, the CMOS/MOSFET manufacturing process requires other fabrication processes that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses through the top electrode and the side of the capacitor to the thin film of metal-oxide capacitor dielectric (e.g., ferroelectric layered superlattice material) and reduces the oxides contained in the dielectric material. The absorbed hydrogen also metallizes the surface of the dielectric thin film by reducing metal oxides. The adhesivity of the dielectric thin film to the upper electrode is lowered by the chemical change taking place at the interface. Alternatively, the upper electrode is pushed up by the oxygen gas, water, and other products of the oxidation-reduction reactions taking place. As a result of these effects, the electronic properties of the capacitor are degraded, and peeling is likely to take place at the interface between the top electrode and the dielectric thin film. In addition, hydrogen also can reach the lower electrode, leading to internal stresses that cause the capacitor to peel off its substrate. These problems are acute in ferroelectric memories containing layered superlattice material compounds because these metal oxide compounds are particularly complex and prone to degradation by hydrogen-reduction. After a forming-gas anneal (FGA), the remanent polarization of the ferroelectrics typically is very low and no longer suitable for storing information. Also, an increase in leakage currents results.

Several methods have been reported in the art to inhibit or reverse hydrogen degradation of desired electronic properties in ferroelectric oxide materials. Oxygen annealing at high temperature (800° C.) for about one hour results in virtually complete recovery of the ferroelectric properties degraded by hydrogen treatments. However, the high-temperature oxygen anneal itself may generate defects in silicon crystalline-structure, and it may offset somewhat the positive effects of any prior forming-gas anneal on the CMOS characteristics. Special metallization layers and diffusion barrier layers have also been examined to minimize the effects of hydrogen during high-energy processes and forming-gas annealing processes. The metallization schemes typically involve the use of materials that are prone to oxidation in an oxygen-containing environment at temperatures above 400° C. Aluminum, the primary metallization material, has a low melting point and cannot tolerate temperatures above 450° C. Thus, oxygen annealing of an integrated circuit substrate to repair prior hydrogen degradation is often not practically possible. Encapsulation of metal-oxide capacitor dielectric with hydrogen-diffusion barriers has been proposed in the prior art; nevertheless, it is often not completely effective, and it typically requires complex process schemes including depositing and removing the hydrogen barrier material.

SUMMARY OF THE INVENTION

Structures and methods in accordance with the invention provide integrated circuits that avoid the degradation of electronic properties resulting from undesired diffusion of oxygen and hydrogen within an integrated circuit, especially within ferroelectric memory cells, but which do not add substantial changes to conventional CMOS processing or introduce complicated process schemes.

In one aspect, an embodiment in accordance with the invention provides an integrated circuit comprising a switch, a capacitor, and a nonconductive oxygen barrier located between the switch and the capacitor. In another aspect, the oxygen barrier comprises strontium tantalate. In still another aspect, the oxygen barrier further comprises silicon nitride. Both strontium tantalate and silicon nitride, alone or together, function as oxygen barriers, as well as hydrogen barriers.

In another aspect, the capacitor comprises a bottom electrode having a bottom-electrode side edge, and at least a portion of the oxygen barrier is located on the bottom-electrode side edge.

In one aspect, an embodiment in accordance with the invention comprises a conductive diffusion barrier comprising a conductive-barrier side edge, wherein the bottom electrode is located on the conductive diffusion barrier, and wherein at least a portion of the nonconductive oxygen barrier is located on the conductive-barrier side edge. Typically, a first insulator layer is located between the switch and the capacitor, and the conductive diffusion barrier is located on a portion of the insulator layer, and a portion of the oxygen barrier is located on the insulator layer.

In another aspect, the first insulator layer comprises a moat region, the moat region being defined partially by a moat sidewall and a moat bottom. In another aspect, the moat region is substantially coplanar with the bottom electrode and the conductive diffusion barrier. In another aspect, a portion of the nonconductive oxygen barrier is disposed on the moat bottom, and a portion of the nonconductive oxygen barrier is disposed on the moat sidewall.

In another aspect, the first insulator layer comprises an over-etched portion aligned with the conductive-barrier side edge, wherein the bottom-electrode side edge, the conductive-barrier side edge, and the over-etched portion define a moat sidewall, and at least a portion of the oxygen barrier layer is located on the bottom-electrode side edge, the conductive-barrier side edge, and the over-etched portion.

In another aspect, the conductive diffusion barrier and the nonconductive oxygen barrier together substantially completely cover the switch and together form a substantially continuous diffusion barrier between the capacitor and the switch.

In another aspect, an integrated circuit in accordance with the invention further comprises a nonconductive hydrogen barrier layer, the nonconductive hydrogen barrier layer substantially completely covering the capacitor and the switch. Preferably, the nonconductive hydrogen barrier layer comprises strontium tantalate. Preferably, the nonconductive hydrogen barrier layer further comprises silicon nitride.

In another aspect, the capacitor comprises a top electrode, and a portion of the nonconductive hydrogen barrier layer is located on the top electrode. Preferably, the capacitor comprises a top plate-line electrode, and a portion of the nonconductive hydrogen barrier layer is located on the plate-line electrode. In another aspect, an integrated circuit in accordance with the invention further comprises an electrical connection to the top plate-line electrode and the electrical connection is located remotely from the capacitor. In another aspect, the top electrode comprises a top-electrode side edge, and a portion of the nonconductive hydrogen barrier layer is located on the top-electrode side edge. In still another aspect, the capacitor comprises a capacitor dielectric film comprising a capacitor-dielectric side edge, and a portion of the nonconductive hydrogen barrier layer is located on the capacitor-dielectric side edge. Preferably, the conductive barrier layer comprises titanium aluminum nitride. In another aspect, the nonconductive hydrogen barrier layer substantially completely covers the capacitor and the switch. In still another aspect, an integrated circuit in accordance with the invention further comprises a non-memory portion, and the nonconductive hydrogen barrier layer does not cover the non-memory portion. Preferably, the nonconductive hydrogen barrier layer comprises strontium tantalate. Preferably, the nonconductive hydrogen barrier layer further comprises silicon nitride.

In another aspect, the capacitor comprises a thin film of ferroelectric layered superlattice material. Preferably, the thin film comprises ferroelectric layered superlattice material selected from the group consisting of strontium bismuth tantalate and strontium bismuth tantalum niobate. In still another aspect, the thin film has a thickness not exceeding 90 nm.

In one aspect, an embodiment of an integrated circuit in accordance with the invention comprises an element sensitive to degradation by oxygen and a nonconductive oxygen barrier layer comprising strontium tantalate located to protect the element. In another aspect, the oxygen barrier layer further comprises silicon nitride. In still another aspect, an integrated circuit in accordance with the invention further comprises an electrically conductive diffusion barrier located proximate to the oxygen barrier layer, and the conductive diffusion barrier and the oxygen barrier together form a substantially continuous diffusion barrier to protect the element.

In one aspect, a method of fabricating a memory cell comprises providing a substrate, which substrate contains a switch, a first insulator layer covering the switch, and a conductive plug, wherein the bottom end of the conductive plug is in electrical connection with the switch, and then forming a conductive diffusion barrier layer and a bottom electrode layer on the substrate.

A method further comprises removing a portion of the bottom electrode layer, of the conductive diffusion barrier layer, and of the insulator layer, thereby forming a bottom electrode, a conductive diffusion barrier, and an over-etched portion of the first insulator layer. In another aspect, removing the portion of the insulator layer forms the over-etched portion of the insulator layer and a moat space adjacent to the conductive diffusion barrier and the bottom electrode.

In one aspect, a method further comprises forming a nonconductive oxygen barrier layer on the substrate. In another aspect, forming the oxygen barrier layer comprises depositing a portion of the oxygen barrier layer on a side edge of the bottom electrode. In another aspect, forming the oxygen barrier layer comprises depositing a portion of the oxygen barrier layer on a side edge of the conductive diffusion barrier. In still another aspect, forming the oxygen barrier layer comprises depositing a portion of the oxygen barrier layer on the over-etched portion of the moat sidewall. Preferably, forming the oxygen barrier layer comprises depositing a portion of the oxygen barrier layer on the bottom-electrode side edge, on the conductive-barrier side edge, and on the over-etched portion of the moat sidewall. In still another aspect, forming the oxygen barrier layer comprises depositing a portion of the nonconductive oxygen barrier layer on the first insulator layer. In another aspect, forming the oxygen barrier layer comprises depositing a portion of the oxygen barrier layer on the moat bottom. In still another aspect, forming the oxygen barrier layer comprises depositing the oxygen barrier layer such that the oxygen barrier and the conductive diffusion barrier together substantially completely cover the switch. In still another aspect, forming the oxygen barrier layer comprises forming the oxygen barrier layer proximate to the conductive diffusion barrier such that the oxygen barrier layer and the conductive diffusion barrier together constitute a substantially continuous diffusion barrier between the bottom electrode and the switch. Preferably, forming the oxygen barrier layer comprises depositing strontium tantalate. Preferably, forming the oxygen barrier layer also comprises depositing silicon nitride.

In another aspect, a method in accordance with the invention further comprises forming a capacitor dielectric layer and a top electrode layer on the substrate, forming a memory capacitor on the substrate, and thereafter depositing a nonconductive hydrogen barrier layer on the substrate, such that the hydrogen barrier layer substantially completely covers the memory capacitor and the switch. Preferably, depositing a nonconductive hydrogen barrier layer comprises depositing strontium tantalate. Preferably, depositing a nonconductive hydrogen barrier layer further comprises depositing silicon nitrides.

In another aspect, forming a memory capacitor comprises removing a portion of the top electrode layer to form a top electrode, and depositing a nonconductive hydrogen barrier layer comprises depositing a portion of the nonconductive hydrogen barrier layer on the top electrode. In another aspect, forming a memory capacitor comprises removing a portion of the top electrode layer to form a top plate-line electrode, and depositing a nonconductive hydrogen barrier layer comprises depositing a portion of the nonconductive hydrogen barrier layer on the plate-line electrode. In still another aspect, forming a memory capacitor includes forming a top plate-line electrode having a top-electrode side edge, and depositing a nonconductive hydrogen barrier layer includes depositing a portion of the nonconductive hydrogen barrier layer on the top-electrode side edge.

In another aspect, a method in accordance with the invention comprises removing a portion of the capacitor dielectric layer to form a capacitor dielectric film having a capacitor-dielectric side edge, and depositing a nonconductive hydrogen barrier layer comprises depositing a portion of the nonconductive hydrogen barrier layer on the capacitor-dielectric side edge. In still another aspect, a method further includes removing a non-memory portion of the nonconductive hydrogen barrier layer from the substrate.

In another aspect, forming of the dielectric layer comprises depositing metal oxide precursor material for forming ferroelectric layered superlattice material. Preferably, forming the dielectric layer comprises forming a layered superlattice material selected from the group consisting of strontium bismuth tantalate and strontium bismuth tantalum niobate. Preferably, forming the dielectric layer includes heating the precursor material using RTP at a temperature in a range of about from 400° C. to 800° C. for a total duration of less than 30 minutes. More preferably, the total duration comprises less than 15 minutes. Even more preferably, the total duration comprises less than 5 minutes.

DETAILED DESCRIPTION OF THE INVENTION

Figure 1:
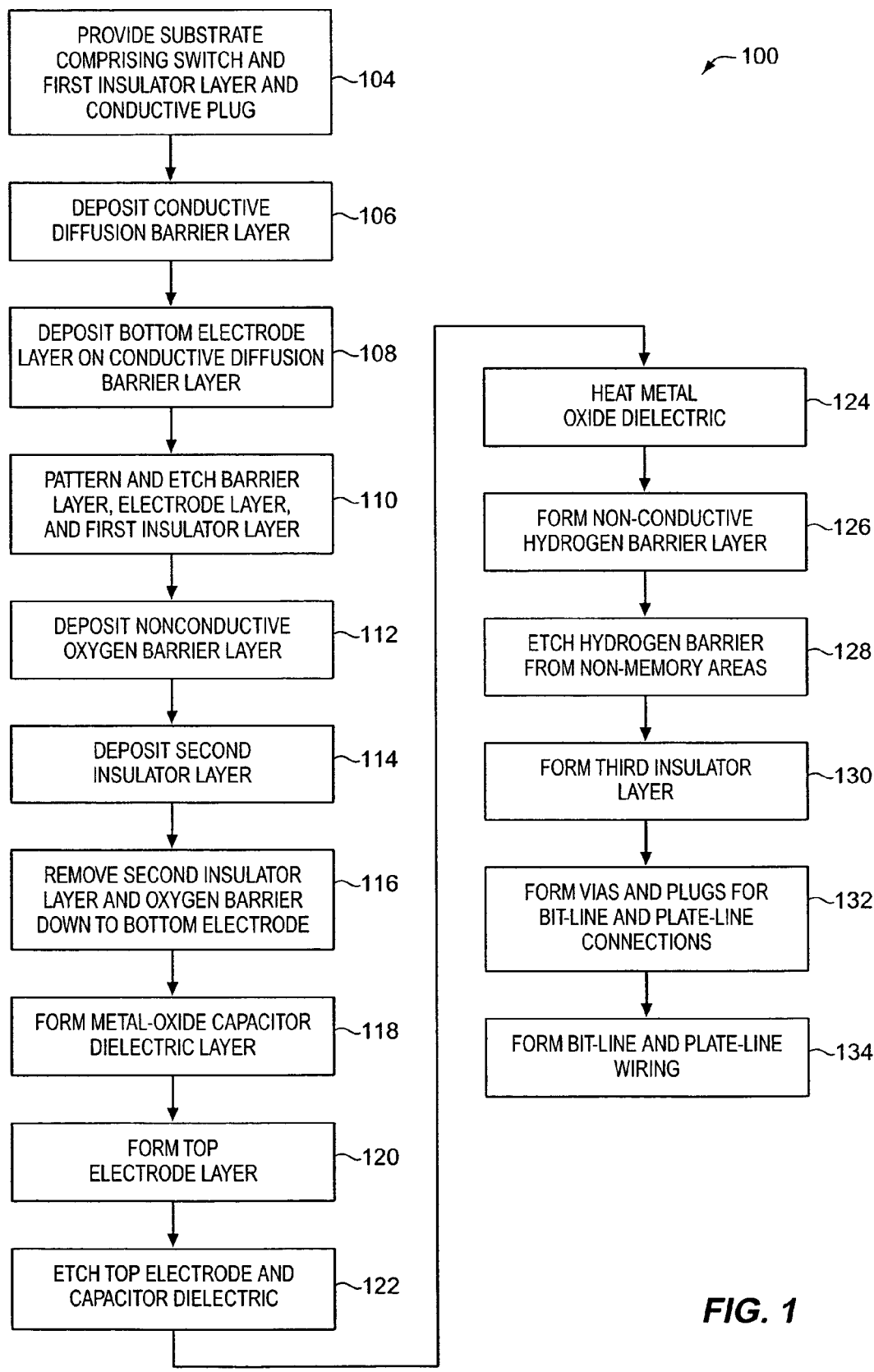
FIG. 1 depicts a flow sheet of fabrication steps of a method in accordance with the invention for making a preferred embodiment of a ferroelectric memory in accordance with the invention.

Embodiments in accordance with the invention are described herein with reference to FIGS. 1–14. It should be understood that FIGS. 2–14, depicting integrated circuits in sequential stages of fabrication in accordance with the invention, are not meant to be actual plan or cross-sectional views of an actual integrated circuit device. In actual devices, the layers will not be as regular and the thicknesses may have different proportions. The various layers in actual devices often are curved and possess overlapping edges. The figures instead show idealized representations which are employed to explain more clearly and fully embodiments of the invention than would otherwise be possible. Also, the figures represent only one of innumerable variations of ferroelectric and dielectric devices that could be fabricated in accordance with the invention.

General manufacturing steps for fabricating integrated circuits containing MOSFETs and ferroelectric capacitor elements are described in U.S. Pat. No. 5,466,629 issued Nov. 14, 1995 to Mihara et al., and U.S. Pat. No. 5,468,684 issued Nov. 21, 1995 to Yoshimori et al., which are hereby incorporated by reference in their entirety. General fabrication methods have been described in other references also.

U.S. Pat. No. 5,519,234 issued May 21, 1996 to Paz de Araujo et al., which is hereby incorporated herein by reference in its entirety, discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995 to Watanabe et al. and U.S. Pat. No. 5,468,684 issued Nov. 21, 1995 to Yoshimori et al., also both hereby incorporated by reference in their entirety, describe processes for integrating these materials into practical integrated circuits.

The layered superlattice materials may be summarized generally under the formula:

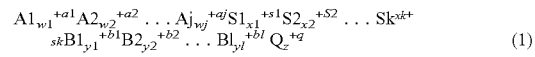

(1)

where A1, A2 . . . Aj represent A-site elements in the perovskite-like structure, which may be elements such as strontium, calcium, barium, bismuth, lead, and others; S1, S2 . . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2. . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz.$$ (2)

Formula (1) includes all three of the Smolenskii type compounds discussed in U.S. Pat. No. 5,519,234 issued May 21, 1996 to Paz de Araujo et al., referenced above. The layered superlattice materials do not include every material that can be fit into Formula (1), but only those which form crystalline structures with distinct alternating layers.

U.S. Pat. No. 5,803,961 issued Sep. 8, 1998 to Azuma et al., which is hereby incorporated herein by reference in its entirety, discloses that mixed layered superlattice materials, such as strontium bismuth tantalum niobate, can have even more improved properties in ferroelectric applications. The mixed layered superlattice materials are characterized by nonstoichiometric amounts of A-site and B-site elements.

For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$ (SBTN), are being used and are under further development for use as capacitor dielectric in nonvolatile memory applications, such as in FeRAMs and nondestructible read-out ferroelectric FETs. Polycrystalline thin films of these layered superlattice materials, as well as other layered superlattice materials represented by Formula (1), may be fabricated and used in accordance with the invention.

The word "substrate" can mean the underlying semiconductor material 204 on which the integrated circuit is formed, as well as any object on which a thin film layer is deposited. In this disclosure, "substrate" shall generally mean the entire workpiece as it exists at a particular phase of fabrication and on which a particular fabrication step is being conducted.

The long dimensions of integrated circuit substrate 202 and semiconductor material 204 in FIGS. 2–13 define planes that are considered to be a "horizontal" plane herein, and directions perpendicular to this plane are considered to be "vertical". Terms of orientation herein, such as "above", "top", "upper", "below", "bottom" and "lower", mean relative to the semiconductor material 204. That is, if a second element is "above" a first element, it means it is farther from the semiconductor material 204; and if it is "below" another element, then it is closer to the semiconductor material 204 than the other element. Terms such as "above" and "below" do not, by themselves, signify direct contact. However, terms such as "on" or "onto" do signify direct contact of at least a portion of one layer with at least a portion of an underlying or adjacent layer. As depicted in FIGS. 2–13, a single layer of memory cells comprising switches and capacitors is formed on semiconductor material 204 of an integrated circuit substrate 202. It is understood that embodiments in accordance with the invention also provide a plurality of layers of memory cells formed sequentially one on top of the other on a single integrated circuit substrate.

The term "thin film" is used herein as it is used in the integrated circuit art. Generally, it means a film of less than a micron in thickness. The thin films disclosed herein are usually less than 500 nm in thickness, and more typically in a range of about from 5 nm to 200 nm. For example, a thin film of layered superlattice material fabricated in an integrated circuit in accordance with the invention typically has a final thickness in a range of from 25 nm to 150 nm. These thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The term "strontium tantalate" (or "strontium tantalum oxide") means herein any one or several of the oxide compounds comprising strontium and tantalum. Strontium tantalate in accordance with the invention is represented herein by the generalized stoichiometric formula $SrTaO_x$, which represents strontium tantalate compounds including, but not limited to, $SrTa_2O_6$ and $Sr_2Ta_2O_7$.

The terms "region" and "area" as used herein generally have their usual meaning; that is, "area" generally designates a two-dimensional surface, whereas a "region" is generally three-dimensional. For example, a "non-memory area" of a layer or a substrate in this specification generally corresponds to a "non-memory region" of an integrated circuit located below or above a non-memory area.

The terms "dielectric thin film", "capacitor dielectric", and similar terms referring to a thin film of dielectric material between electrodes in a capacitor are used broadly to include not only the purely insulating dielectric materials, but also ferroelectric materials that are both dielectric and ferroelectric, such as certain $ABO_3$-type oxides and, in particular, ferroelectric layered superlattice materials.

The term "continuous" and similar terms used to describe a diffusion barrier layer or a combination of diffusion barriers, means unbroken or uninterrupted. The term "substantially continuous" refers to a layer that has a small interruption or break, for example, a layer through which a conductive electrical connection passes.

The diagram of FIG. 1 is a flow sheet of fabrication steps of a method 100 in accordance with the invention for making a preferred embodiment of a ferroelectric memory in accordance with the invention. Although method 100 of FIG. 1 is discussed herein with reference to FIGS. 2–14 representing a ferroelectric memory comprising a thin film of polycrystalline layered superlattice material, it is clear that the method of FIG. 1 and numerous embodiments of a method in accordance with the invention are useful generally for fabricating an integrated circuit that provides protection of one or more elements of the integrated circuit against undesired diffusion of a chemical species to or away from the element.

Figure 2:
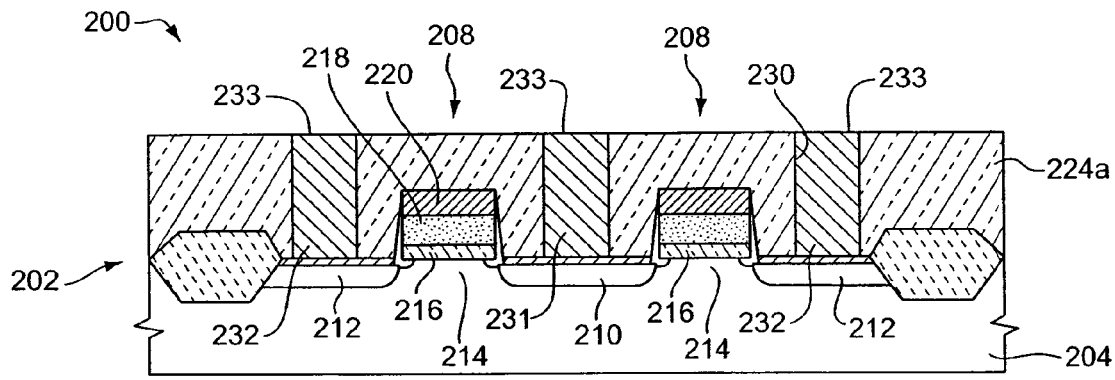
FIG. 2 depicts an intergrated circuit substrate in accordance with the invention containing silicon semiconductor material, field oxide regions and switches ("MOSFETs")

FIG. 2 depicts in schematic form a section 200 of an integrated circuit substrate 202. In processes 104, a substrate 202 is provided containing silicon semiconductor material 204, field oxide regions 206, and switches 208. A switch 208 is typically a metal-oxide semiconductor field-effect transistor ("MOSFET"), formed using techniques known in the art. A MOSFET switch 208 includes source/drain regions 210, 212, a channel region 214, gate buffer layer 216, gate insulating layer 218, and gate electrode 220. Section 200 further includes a first insulator layer 224a, typically called an interlayer dielectric layer ("ILD"), disposed on substrate 202, and covering semiconductor material 204, oxide regions 206 and switches 208. First insulator layer 224a typically comprises nondoped silicate glass ("NSG") or a doped glass, such as BPSG (boron-doped phospho-silicate glass) and is typically formed using a CVD technique as known in the art. In other embodiments in accordance with the invention, integrated circuit substrate 202 comprises gallium arsenide or other semiconductor, or an insulator such as magnesium oxide (MgO). Substrate 202 further includes vias 230 in which conductive bit-line plug 231 and conductive capacitor plug 232 are disposed. Electrically conductive plugs 231, 232 typically are formed by filling vias 230 with electrically conductive material and planarising the surface of substrate 202 so that tops 233 of plugs 232 are approximately coplanar with first insulator layer 224a, as depicted in FIG. 2. Plugs 231, 232 are formed so that bottom 234 of each plug 231, 232 is in electrical contact with switch 208. Preferably, conductive plugs 231, 232 comprise tungsten, which is deposited using techniques known in the art. In more preferred embodiments, plugs 231, 232 are formed by depositing a layer of titanium having a thickness in a range of about from 5 nm to 30 nm in via 230, followed by depositing a layer of titanium nitride having a thickness in a range of about from 5 nm to 30 nm on the titanium, followed by deposition of tungsten.

Figure 3:
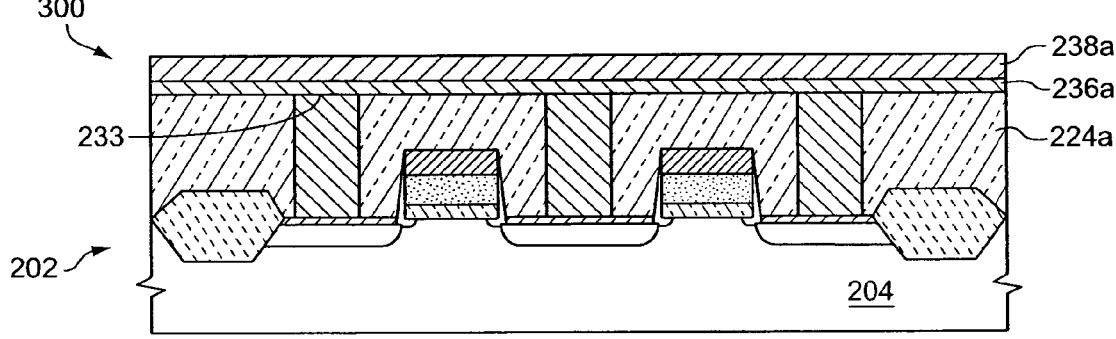
FIG. 3 depicts in schematic form the section of FIG. 2 in a later stage of fabrication after deposition of an electrically conductive oxygen-diffusion barrier layer and a bottom electrode layer in accordance with the invention.

In processes 106, electrically conductive oxygen-diffusion barrier layer 236a is deposited on substrate 202, covering first insulator layer 224a and conductive plugs 231, 232, as depicted in FIG. 3, showing section 300. In preferred embodiments, electrically conductive oxygen-diffusion barrier layer 236a comprises a laminate structure comprising an iridium oxide sublayer, which is on an iridium sublayer, which is on a titanium aluminum nitride sublayer, as represented by $IrO_x/Ir/TiAlN$. A preferred laminate stack is fabricated by first sputtering a sublayer of titanium aluminum nitride having a thickness of about 50 nm onto first insulator layer 224a and conductive plugs 232, then sputtering about 100 nm iridium metal onto the nitride sublayer, and then sputtering about 100 nm of iridium oxide onto the iridium sublayer.

In processes 108, bottom electrode layer 238a is formed on conductive diffusion barrier layer 236a, as depicted in FIG. 3. Preferably, bottom electrode layer 238a has a thickness of about 100 nm and comprises platinum. Typically, bottom electrode layer 238a is formed by sputtering a platinum target, using techniques known in the art. Preferably, the electrode is formed by RF sputtering of a platinum single layer, but it also may be formed by DC sputtering, ion beam sputtering, vacuum deposition, or other appropriate conventional deposition process. The bottom and top electrodes of memory capacitors in accordance with the invention preferably contain platinum. Nevertheless, in certain embodiments, a bottom electrode comprises another non-oxidized precious metal, such as palladium, silver, and gold. In addition to the precious metals, a metal such as aluminum, aluminum alloy, aluminum silicon, aluminum nickel, nickel alloy, copper alloy, and aluminum copper may be used to form electrodes of a memory capacitor in accordance with the invention.

Figure 4:
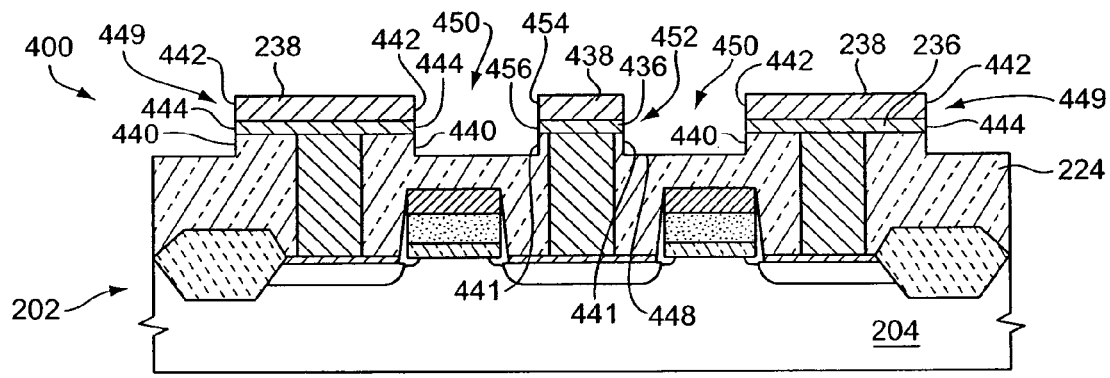
FIG. 4 depicts in schematic form the section of FIG. 3 in a later stage of fabrication after a portion of the bottom electrode layer, a portion of the conductive diffusion barrier layer, and a portion of a first insulator layer were removed in accordance with the invention.

In processes 110, a portion of bottom electrode layer 238a, of conductive diffusion barrier layer 236a, and of first insulator layer 224a are removed, thereby forming bottom electrode 238, conductive diffusion barrier 236, and insulator layer 224, as depicted in FIG. 4, showing section 400. Processes 110 also result in formation of bit-line barrier 436 and bit-line pad 438, and in formation of over-etched portions 440 of insulator layer 224. Over-etched portions 440, 441 comprise the vertical surface of insulator layer 224 located below conductive diffusion barrier 444 and below bit-line barrier 436, respectively, which are formed by removing a portion of insulator layer 224a lower than conductive barrier layer 236a, as depicted in FIG. 4. Removal of a portion of insulator layer 224a in processes 110 results in formation of a moat bottom 448. Each of bottom electrodes 238 has a bottom-electrode side edge 442. Conductive diffusion barriers 236, located on top end 233 of conductive plugs 232 have a conductive-barrier side edge 444. Moat sidewalls 449 typically comprise bottom-electrode side edge 442, conductive-barrier side edge 444, and over-etched portions 440. Moat bottom 448 and moat sidewall 449 partially define moat space 450. Moat 450 is also partially defined by moat sidewall 452, which comprises bit-line pad sidewall 454, bit-line barrier sidewall 456, and over-etched portion 441 in FIG. 4. In preferred embodiments, a TEOS hardmask having a thickness of about 300 nm is deposited on bottom electrode layer 238a using a CVD technique known in the art. The TEOS hardmask then is patterned using photolithography techniques known in the art; for example, by depositing a resist, then exposing and developing the resist. A stack etch is then conducted, typically using RIE, to etch portions of layers 238a, 236a, and 224a corresponding to moat space 450 down to below conductive barrier layer 236. The hardmask then is removed from the top surface of bottom electrode 238 using techniques known in the art.

Figure 5:
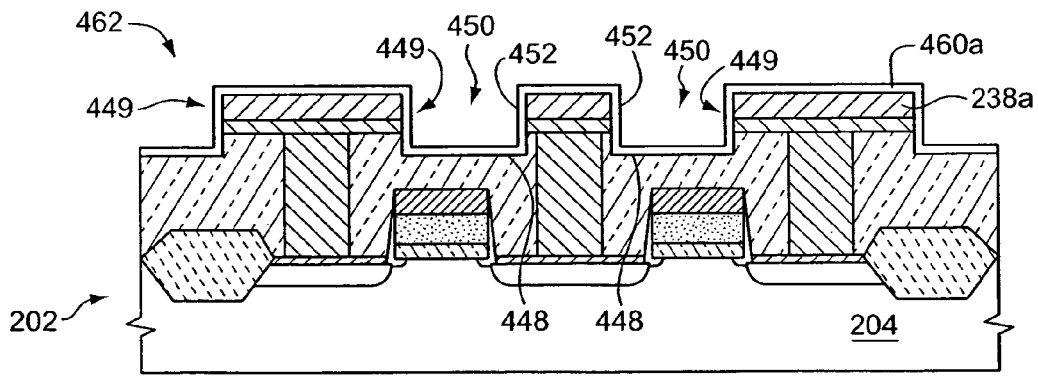
FIG. 5 depicts in schematic form the section of FIG. 4 in a later stage of fabrication after deposition of a nonconductive oxygen barrier layer in accordance with the invention.

In processes 112, nonconductive oxygen barrier layer 460a is deposited onto substrate 202, in particular, including the top surface of bottom electrode 238 and on exposed surfaces of moat 450, thereby covering moat bottom 448 and moat sidewalls 449, 452, as depicted in FIG. 5, showing section 462 of integrated circuit substrate 202. Preferably, nonconductive oxygen barrier layer 460a comprises strontium tantalum oxide ("strontium tantalate"), having a thickness of about 75 nm. Alternatively, nonconductive hydrogen barrier layer 460a comprises a laminate structure, which laminate structure comprises a sublayer of strontium tantalate, $SrTaO_x$, and a sublayer of silicon nitride, SiN. Preferably, strontium tantalate or a $SrTaO_x/SiN$ double-layer is deposited using a MOCVD process and other techniques and structures as described in co-owned and co-pending U.S. patent application Ser. No. 09/998,469 filed Nov. 29, 2001, which is hereby incorporated by reference. Where barrier layer 460a includes only $SrTaO_x$, a 75 nm thick layer of STO is preferably deposited employing MOCVD. Where barrier layer 508 includes both $SrTaO_x$, and SiN, a 75 nm thick sublayer of $SrTaO_x$ is preferably deposited first in a MOCVD process conducted at between 400° C. and 600° C., employing a SrTa (strontium tantalum) single source precursor. Thereafter, a layer of SiN, preferably 50 nm to 150 nm thick, is deposited, preferably employing CVD. In an alternative embodiment, the SiN portion of barrier layer 460a may be deposited first, and a layer of $SrTaO_x$ is then deposited on the SiN portion. Liquid spin-on and other liquid-source deposition techniques are also suitable for depositing strontium tantalate in accordance with the invention.

Figure 6:
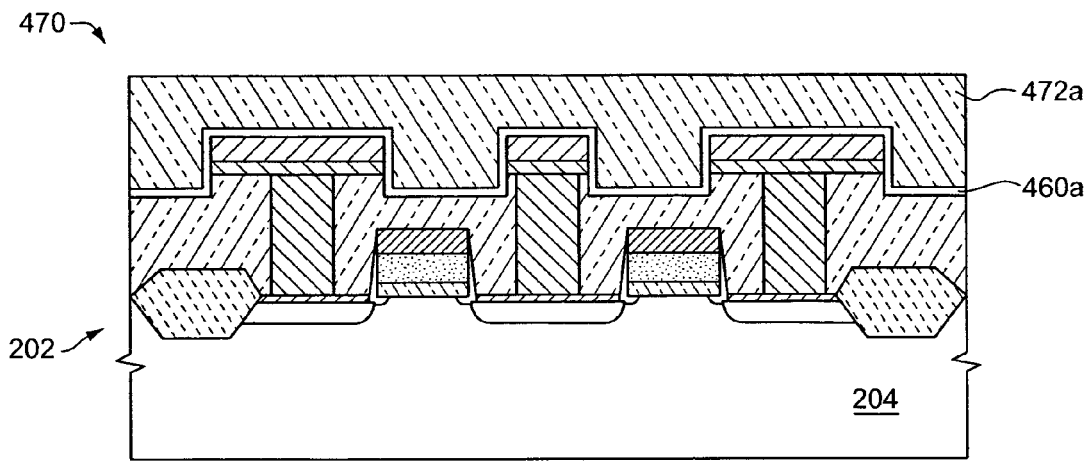
FIG. 6 depicts in schematic form the section of FIG. 5 in a later stage of fabrication after deposition of a second insulator layer (ILD) on the substrate, thereby covering the nonconductive oxygen barrier layer.

In processes 114, as depicted in FIG. 6, showing section 470, second insulator layer 472a is formed on substrate 202, in particular on nonconductive oxygen barrier layer 460a by depositing approximately 500 nm NSG or doped silicate glass by reacting TEOS or other known precursor using a PECVD technique known in the art.

Figure 7:
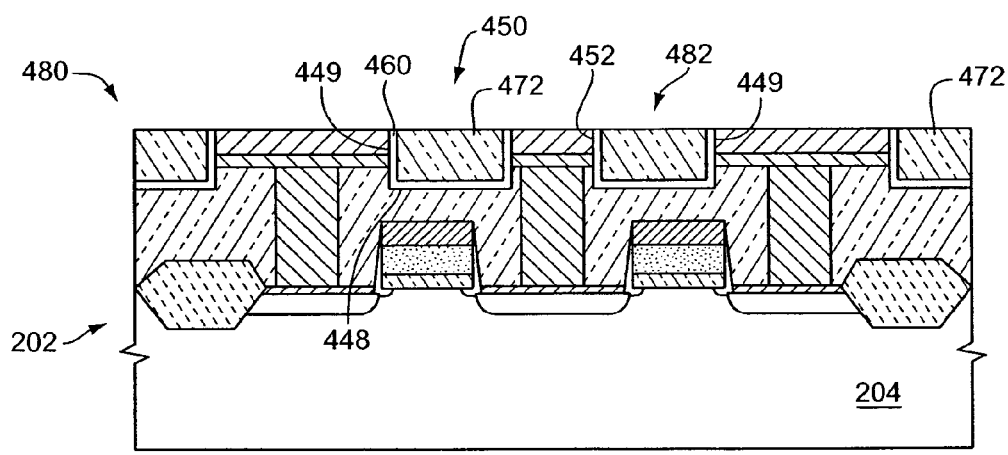
FIG. 7 depicts in schematic form the section of FIG. 6 in a later stage of fabrication after removal of portions of a second insulator layer and of the nonconductive oxygen barrier layer.

In processes 116, portions of second insulator layer 472a and nonconductive oxygen barrier layer 460a are removed from substrate 202, as depicted in FIG. 7, showing section 480. In particular, the portions of second insulator layer 472a and nonconductive oxygen barrier layer 460a are completely removed from substrate 202 except for second insulator layer 472 and nonconductive oxygen barrier layer 460 disposed in moat 450. Thus, as depicted in FIG. 7, nonconductive oxygen barrier layer 460 covers moat bottom 448 and moat sidewalls 449. Moat sidewall 449 comprises bottom-electrode side edge 442, conductive-barrier side edge 444, and over-etched portion 440, which are covered by nonconductive oxygen barrier layer 460. Nonconductive oxygen barrier layer 460 covers moat sidewall 452, thereby covering bit-line pad sidewall 454 and bit-line barrier sidewall 456, as well as over-etched portion 441. Typically, in processes 116, second insulator layer 472a and nonconductive oxygen barrier layer 460a are etched using a conventional technique, and then substrate 202 is planarized using a CMP technique known in the art to form planarized surface 482.

Figure 8:
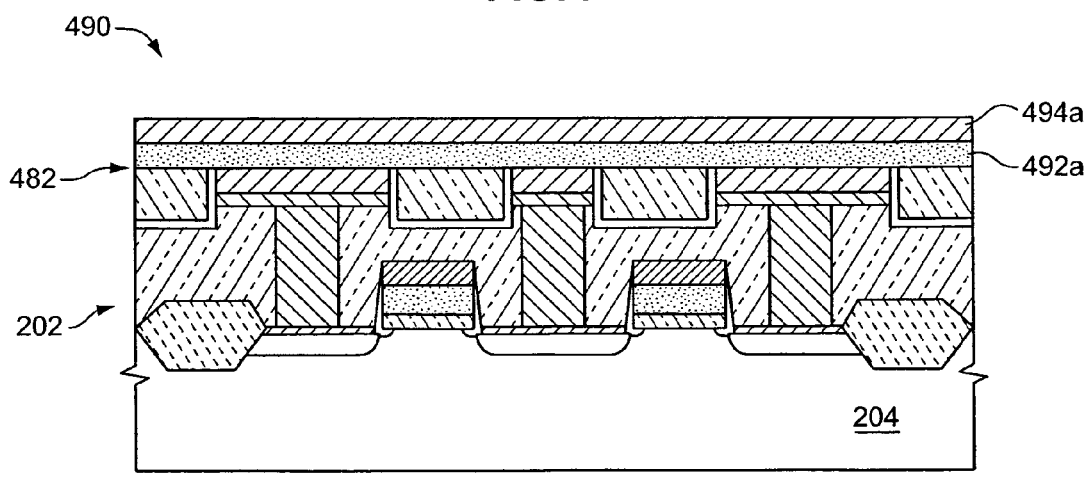
FIG. 8 depicts in schematic form the section of FIG. 7 in a later stage of fabrication after deposition of a metal-oxide capacitor dielectric layer and a top electrode layer in accordance with the invention.

In processes 118, metal-oxide capacitor dielectric layer 492a is formed on planarized surface 482 of substrate 202, as depicted in FIG. 8, showing section 490. Embodiments in accordance with the invention are particularly useful for protecting against undesired diffusion in integrated circuits comprising metal-oxide dielectric thin films comprising ferroelectric layered superlattice material. Prior to step 118 of preferred embodiments, chemical precursors of the desired layered superlattice material are prepared. Usually, precursor solutions are prepared from commercially available solutions containing the chemical precursor compounds. If necessary, the concentrations of the various precursors supplied in the commercial solutions are adjusted to accommodate particular manufacturing or operating conditions. More preferred embodiments in accordance with the invention utilize a final liquid precursor solution containing relative molar proportions of the elements strontium, bismuth, tantalum, and niobium corresponding approximately to $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_c O_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$. Liquid-source metal organic chemical deposition ("LSMCD") and CVD methods for preparing thin films of ferroelectric layered superlattice material have been described in the prior art, including U.S. Pat. No. 6,326,315 issued Dec. 4, 2001 to Uchiyama et al., U.S. Pat. No. 6,245,580 issued Jun. 12, 2001 to Solayappan et al., and U.S. Pat. No. 6,110,531 issued Aug. 29, 2000 to Paz de Araujo et al., which are hereby incorporated by reference in their entirety. In preferred embodiments, dielectric layer 492a comprising ferroelectric layered superlattice material has a thickness in a range of about from 25 nm to 300 nm. Preferably, processes 118 include a pre-top-electrode RTP treatment ("pre-TE RTP") in accordance with a preferred low-thermal-budget method for forming layered superlattice material, as described in co-owned and co-pending U.S. patent application Ser. No. 10/302,441 filed Nov. 22, 2002, having the title "Low Thermal Budget Fabrication of Ferroelectric Memory Using RTP", which is hereby incorporated by reference.

In processes 120, a top plate-line electrode layer 494a is deposited on ferroelectric layer 492a, as depicted in FIG. 8. Typically, top plate-line electrode layer 494a is formed by depositing about 150 nm to 200 nm of platinum using a sputtering technique as known in the art. Preferably, the electrode is formed by RF sputtering of a platinum single layer, but it also may be formed by DC sputtering, ion beam sputtering, vacuum deposition, or other appropriate conventional deposition process.

Figure 9:
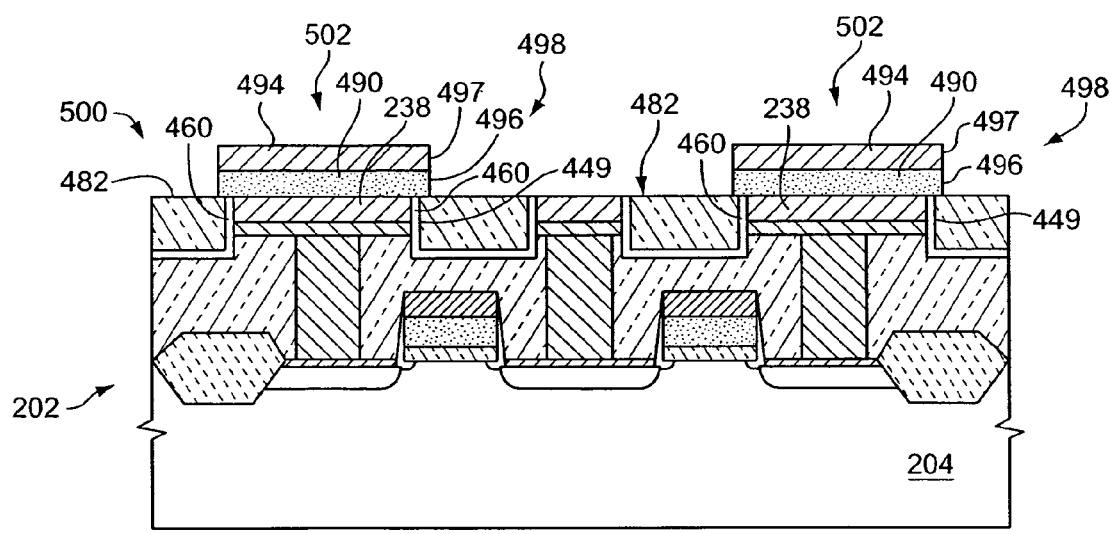
FIG. 9 depicts in schematic form the section of FIG. 8 in a later stage of fabrication after removal of portions of the metal-oxide capacitor dielectric layer and of the top electrode layer in accordance with the invention.

In processes 122, top plate-line electrode layer 494a and metal-oxide capacitor dielectric layer 492a are etched to form dielectric thin film 492 and top plate-line electrode 494, as depicted in FIG. 9 showing section 500. Top plate-line electrode 494 defines a plate-line axis that is normal to the plane of FIG. 9. In processes 122, a TEOS hardmask is formed. In preferred embodiments, a TEOS hardmask having a thickness of about 300 nm is deposited on the top surface of top electrode layer 494a (see FIG. 8) using a CVD technique known in the art. The TEOS hardmask then is patterned using photolithography techniques known in the art, for example, by depositing a resist, then exposing and developing the resist. A stack etch is then conducted, typically using RIE, to etch portions of layers 492a, 494a corresponding to stacks 502 approximately down to surface 482. The hardmask then is removed from the top surface of top electrode 494 using techniques known in the art, typically RIE. Preferably, stacks 502 are patterned and etched to be slightly wider than bottom electrode 238 and to overlap the portion of stack oxygen barrier layer 460 that covers moat sidewall 449, as depicted in FIG. 9. Capacitor dielectric film 490 comprises dielectric side edge 496. Top plate-line electrode 494 comprises top-electrode side edge 497. Side edges 496, 497 define top-stack sidewall 498.

Generally, in processes 124, a final heating of metal oxide dielectric 238 in oxygen or nonreactive gas is conducted after etching processes 122 in order to achieve desired electronic properties of polycrystalline metal oxide. In preferred embodiments, capacitor dielectric 238 comprising ferroelectric layered superlattice material has a thickness in a range of about from 25 nm to 300 nm. Preferably, a thin film of ferroelectric layered superlattice material and other elements of a memory capacitor are fabricated using a low-thermal-budget technique. Co-owned and co-pending U.S. patent application Ser. No. 10/302,441, referenced above, teaches fabrication of thin and ultra-thin films of ferroelectric layered superlattice material in nonvolatile memory capacitors. In an exemplary method, each of a series of 4-inch wafers was processed using MOCVD in a commercially-available AIXTRON Model 1802 CVD apparatus. Each wafer was heated 170° C. and rotated at approximately 10 rpm. The reaction chamber and liquid delivery systems were maintained at a pressure of approximately 6 mbar. The reaction chamber space was heated to a temperature of about 450° C. Liquid flow streams of approximately 0.2 ccm of each of a 0.2 molar SrTa-ethoxide precursor solution in toluene and a 0.05 molar solution of triphenyl bismuth in n-butyl acetate were heated to 200° C. in the liquid delivery system and vaporized at 200° C. and 6 mbar. Argon carrier gas at a flow rate of approximately 200 ccm carried the vaporized precursors into the reaction chamber into which approximately 1500 ccm of oxygen gas was also flowed. A ferroelectric ("FE") coating was deposited on the bottom electrode substrate at a rate of about 8 nm/min. The FE coating on the substrate then was pre-TE RTP-treated in accordance with the invention at 650° C. for 30 seconds in $O_2$ gas, with a ramping rate of 100° C. per second to form a ferroelectric film. Next, platinum was sputter-deposited on the SBT thin film to make a top electrode layer having a thickness of about 200 nm. The top electrode and SBT layers were milled (dry etched) to form capacitors, and then ashing was performed. A post-TE RTP treatment in accordance with a low thermal budget method of the invention then was conducted at a hold temperature of 725° C. for 2 minutes in $O_2$ gas. The resulting SBT thin films had a thickness of about 50 nm, and the ferroelectric capacitors had a surface area of 7854 $\mu m^2$. Thus, each wafer was heated in the temperature range of about from 650° C. to 725° C. for a cumulative heating time of only about 150 seconds, or 2½ minutes. No furnace anneal was conducted. A low-thermal-budget technique is usefully applied in accordance with the present invention because, among other effects, the reduced heating time at elevated temperature reduces the formation of hillocks and other non-uniformities at the surfaces of deposited layers. The resulting enhanced smoothness improves interfacial contacts and inhibits electrical shorting.

Figure 10:
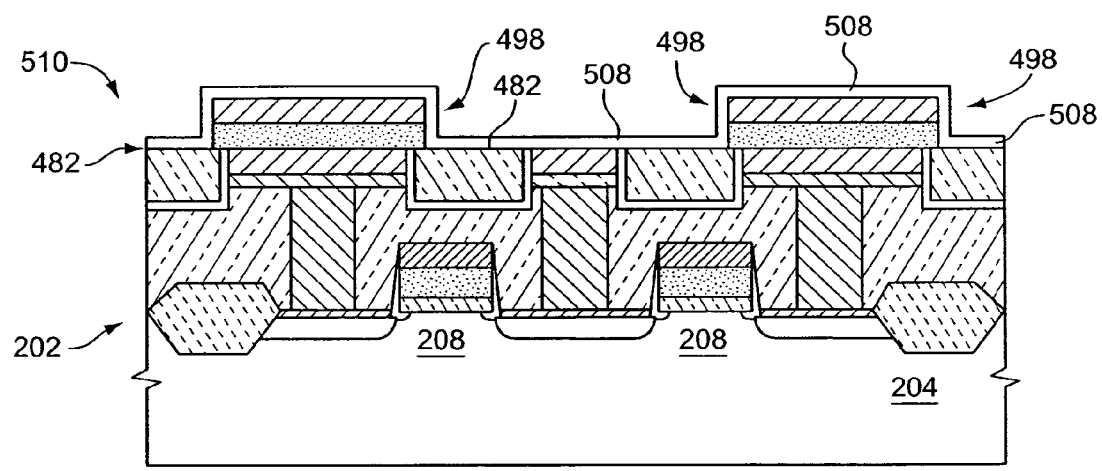
FIG. 10 depicts in schematic form the section of FIG. 9 in a later stage of fabrication after deposition of a nonconductive hydrogen barrier layer on the substrate in accordance with the invention.

In processes 126, an electrically nonconductive hydrogen barrier layer 508 is formed on substrate 202 by depositing it on top plate-line electrode 494, top stack sidewall 498, and on exposed surface 482, as depicted in FIG. 10, showing section 510. As depicted in FIG. 10, nonconductive hydrogen barrier layer 508 completely covers capacitor stacks 502, providing a continuous barrier covering top plate-line electrode 494 along a plate-line axis, and covering top stack sidewall 498 and surface 482. Thus, nonconductive hydrogen barrier layer 508 covers capacitor dielectric side-surface 496 and top electrode side-surface 497. Nonconductive hydrogen barrier layer 508 further covers switch 208 of integrated circuit substrate 202 (although it is ordinarily not in direct contact with switch components such as source/drain regions and gate components). Preferably, nonconductive hydrogen barrier 508 comprises strontium tantalum oxide ("strontium tantalate"), having a thickness of about 75 nm. Alternatively, nonconductive hydrogen barrier layer 508 comprises a laminate structure, which laminate structure comprises a sublayer of strontium tantalate, SrTaO$_x$, and a sublayer of silicon nitride, SiN. Preferably, strontium tantalate or a SrTaO$_x$/SiN double-layer is deposited using a MOCVD process and other techniques and structures as described in co-owned and co-pending U.S. patent application Ser. No. 09/998,469 filed Nov. 29, 2001, which is hereby incorporated by reference. Where barrier layer 508 includes only SrTaO$_x$, a 75 nm thick layer of STO is preferably deposited employing MOCVD. Where barrier layer 508 includes both SrTaO$_x$ and SiN, a 75 nm thick sublayer of SrTaO$_x$ is preferably deposited first in a MOCVD process conducted at between 400° C. and 600° C., employing a SrTa (strontium tantalum) single source precursor. Thereafter, a layer of SiN, preferably 50 nm to 150 nm thick, is deposited, preferably employing CVD. In an alternative embodiment, the SiN portion of barrier layer 508 may be deposited first, and a layer of SrTaO$_x$ is then deposited on the SiN portion. Liquid spin-on and other liquid-source deposition techniques are also suitable for depositing strontium tantalate in accordance with the invention. Portions of nonconductive hydrogen barrier layer 508 are generally removed from non-memory areas (discussed below with reference to FIG. 14) of substrate 202 in processes 128. Typically, resist is deposited and patterned using photolithographic techniques, and then an RIE technique is used to etch nonconductive hydrogen barrier layer 508 from non-memory areas. Both strontium tantalate and silicon nitride, alone or together, function as oxygen barriers, as well as hydrogen barriers.

Figure 11:
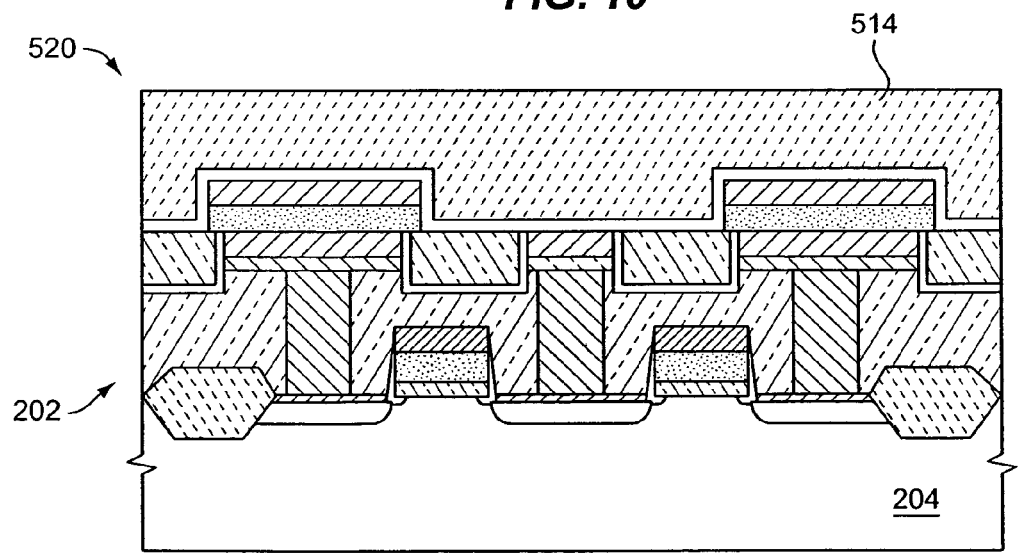
FIG. 11 depicts in schematic form the section of FIG. 10 in a later stage of fabrication after deposition of a third insulator layer (ILD) on the substrate in accordance with the invention.

In processes 130, as depicted in FIG. 11, showing section. 0.520, third insulator layer 514 is formed on substrate 202 by depositing approximately 500 nm NSG or doped silicate glass, typically using TEOS or other precursor in a PECVD technique, as known in the art.

Figure 12:
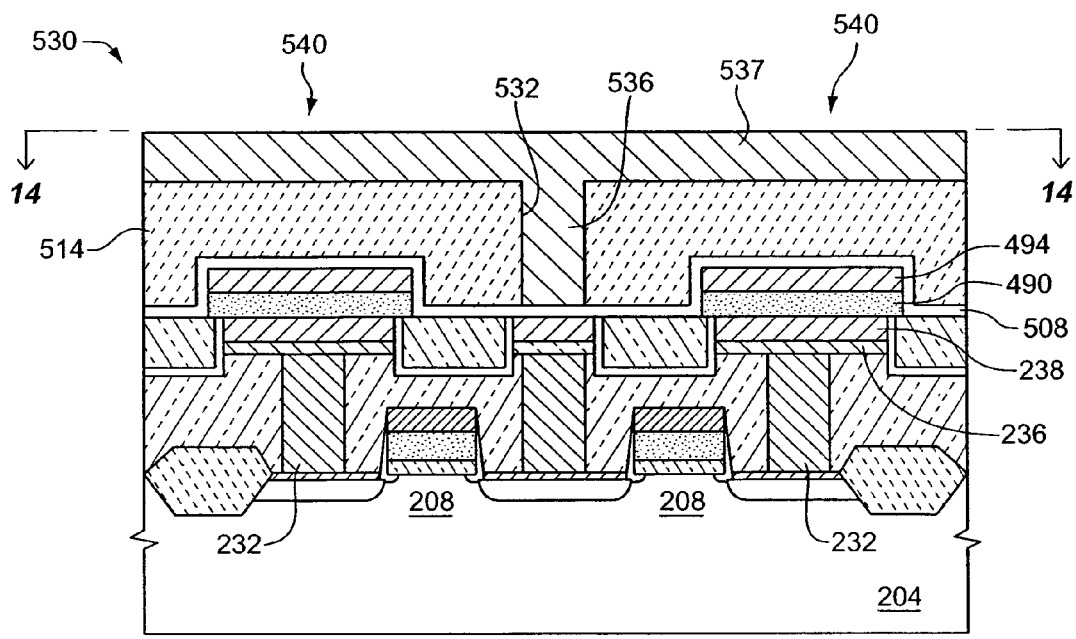
FIGS. 12 and 12A depict in schematic form the section of FIG. 11 in a later stage of fabrication after etching of vias and trenches, followed by deposition of metal in accordance with the invention to form bit-line and plate-line electrical contacts.
Figure 12A:
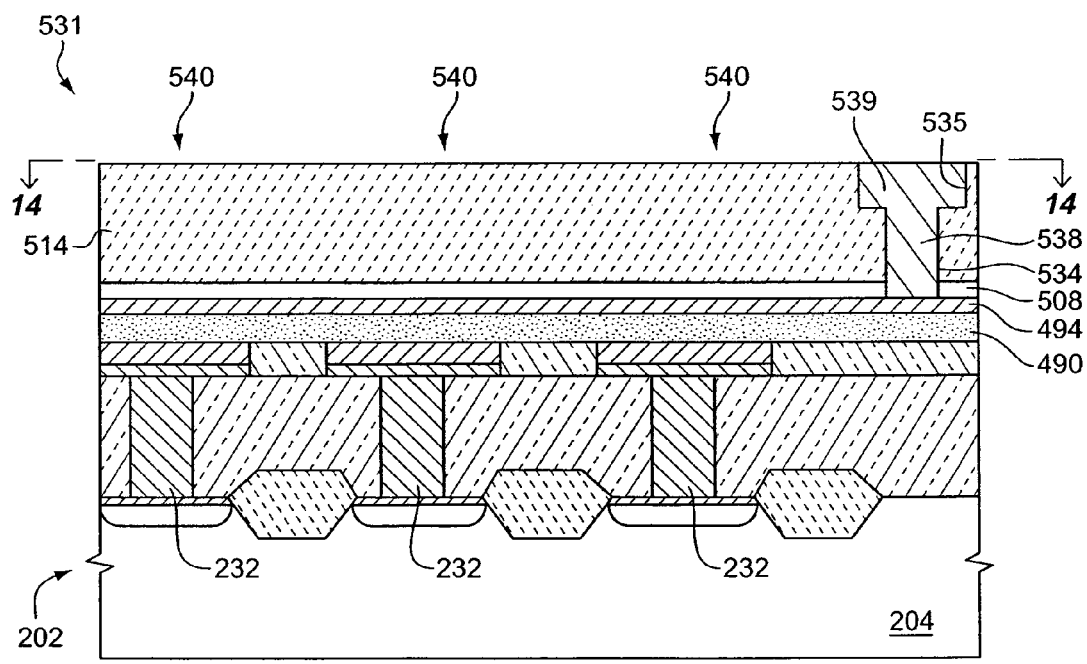

In processes 132, as depicted in FIGS. 12 and 12A, showing sections 530 and 531, respectively, a bit-line contact via 532 is etched through insulator layer 514 and nonconductive hydrogen barrier layer 508 using techniques known in the art. Similarly, a plate-line contact via 534 down to top plate-line electrode 494 and a trench 535 are etched through insulator layer 514 using techniques known in the art. Preferably, via 532, via 534, and trench 535 are filled with metallized wiring material, typically comprising copper, in a single metallization process to form bit line contact 536, bit-line wiring layer 537, plate-line contact 538, and plate-line wiring layer 539. Preferably, plate-line contact 538 or other electrical connection to top plate-line electrode 494 is disposed remotely from capacitors 540, located above each of conductive plugs 232, so that the integrity of hydrogen barrier layer 508 is preserved directly above and near capacitors 540. Wiring layers 537, 539 and contact plugs 536, 538 are typically deposited by a conventional Al—Cu—Si metallization sputtering technique.

Figure 13:
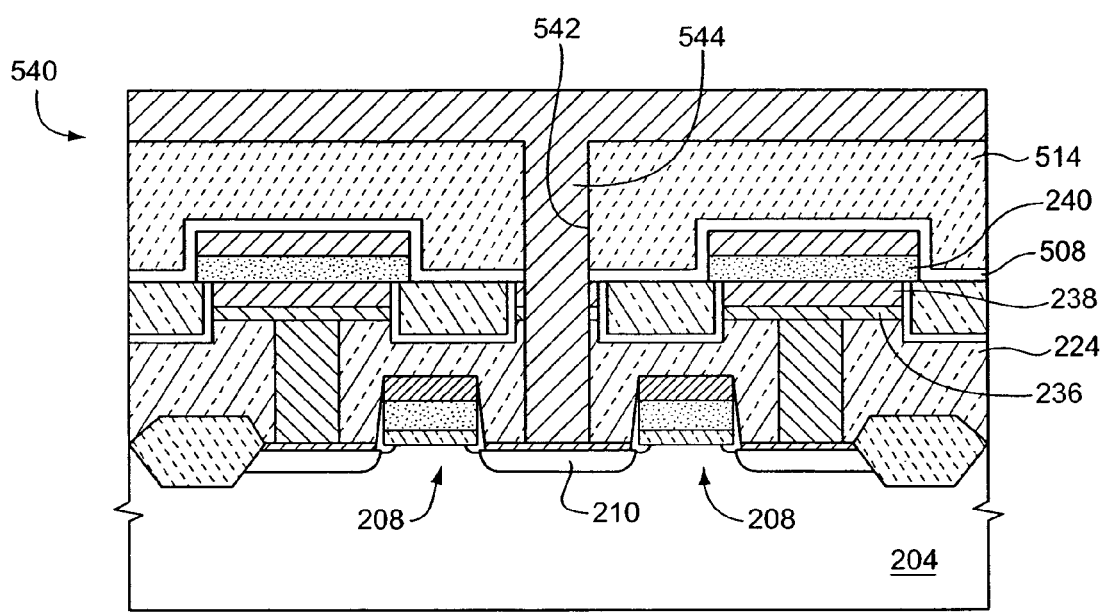
FIG. 13 depicts in schematic form an alternative embodiment in accordance with the invention in which a single conductive plug makes electrical contact from a wiring layer to the switch.

In certain embodiments in accordance with the invention, as depicted in FIG. 13 showing section 540, substrate 202 does not comprise conductive bit-line plug 231. Instead, in processes 132, a via 542 is etched through insulator layer 514, nonconductive hydrogen barrier layer 508, and insulator layer 224 down to source/drain 210 of switch 208. Via 542 then is filled with metallized conductive material to form conductive bit-line plug 544.

Figure 14:
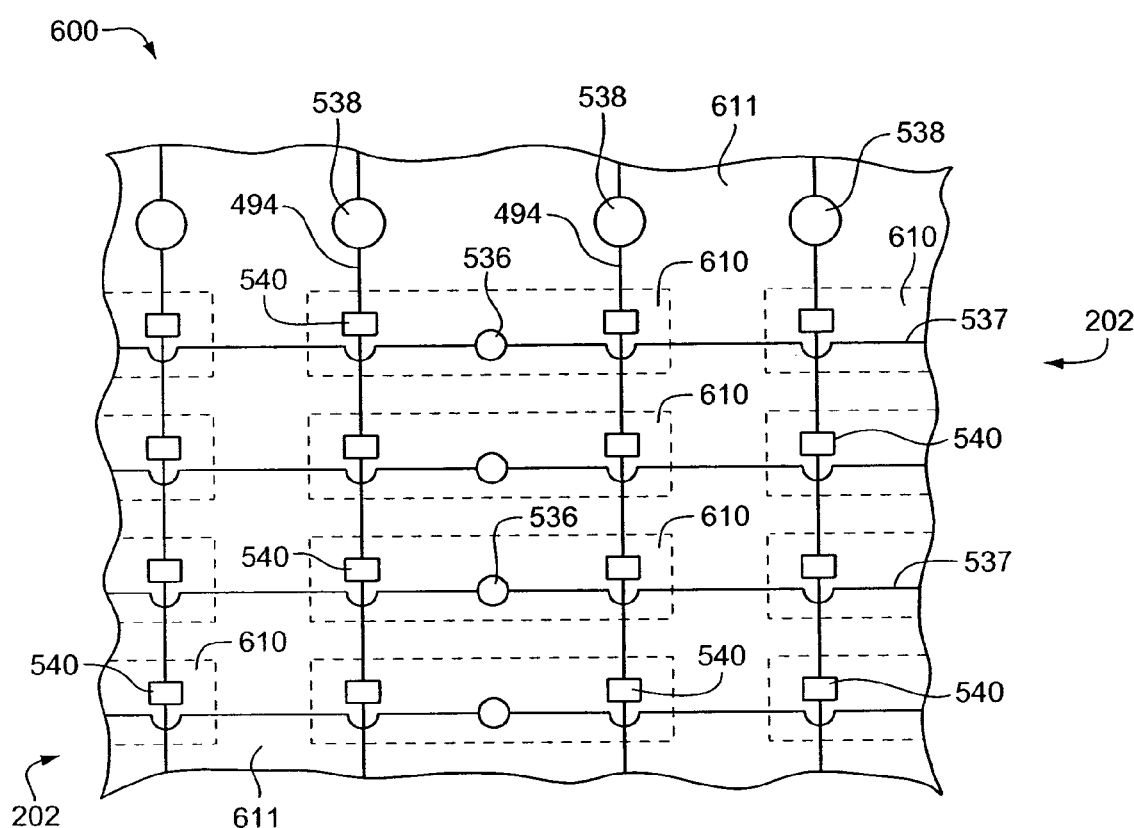
FIG. 14 depicts in schematic form a top-view section of an integrated circuit in accordance with the invention showing relative positions of capacitors, memory regions, non-memory regions, and electrical contacts.

FIG. 14 depicts in schematic form a top view of an extended section 600 of substrate 202 taken approximately through lines 14 of FIGS. 12 and 12A. In section 600, memory regions 610, indicated by dashed rectangles, comprise memory capacitors 540 and MOSFET switches 208 (not shown in FIG. 14). Although memory regions 610 are represented in FIG. 16 as having a rectangular shape, it is clear that memory regions 610 in actual integrated circuits have different shapes depending on the particular shapes, locations, and dimensions of capacitors 540 and switches 208. Non-memory regions of substrate 202 comprise non-memory regions 611 outside memory regions 610, as represented in FIG. 14. As depicted in FIGS. 12 and 14, a memory region 610 typically comprises at least a portion of conductive bit-line connector plug 536, which provides electrical contact between a switch 208 of a memory cell and a bit line 537 of an integrated circuit. In preferred embodiments in accordance with the invention, as depicted in FIGS. 12A and 14, conductive plate-line connector plug 538 (in electrical contact with plate-line electrode 494) is disposed remotely from capacitors 540 and memory regions 610. It is a feature of preferred embodiments in accordance with the invention that nonconductive hydrogen barrier 508 is disposed throughout an extended area, typically substantially the entire area corresponding to a memory region 610. As depicted in FIG. 12, nonconductive hydrogen barrier 508, nonconductive oxygen barrier 460, and conductive diffusion barrier 236 substantially completely envelop capacitor 540, in particular metal oxide dielectric film 490. As a result, metal oxide dielectric film 490 is protected against undesired diffusion of hydrogen or other chemical species into dielectric film 490. Also, the combination of nonconductive hydrogen barrier 508, nonconductive oxygen barrier 460, and conductive diffusion barrier 236 substantially inhibits or prevents undesired diffusion of oxygen and other chemical species from capacitor 540 into other parts of the integrated circuit, particularly into elements of switches 208. As depicted in FIGS. 12 and 13, nonconductive oxygen barrier 460 and conductive diffusion barrier 236 together form a substantially continuous diffusion barrier between metal oxide dielectric 490 and switch 208.

There have been described novel structures and methods of fabricating integrated circuits for protecting devices and elements against physical damage and degradation of electronic properties arising from undesired diffusion of chemical species from one part of an integrated circuit to another, or from undesired diffusion from a processing atmosphere into a sensitive region of an integrated circuit. In particular, certain embodiments in accordance with the invention protect both a switch and a memory capacitor in a memory cell against damage and degradation arising from undesired diffusion of hydrogen and oxygen within an integrated circuit. An advantage of embodiments in accordance with the invention is that a substantially continuous hydrogen diffusion barrier covers both switch and capacitor in a memory cell. Another feature is that a combination of diffusion barriers substantially completely separate one device from another device in an integrated circuit; for example, a combination in accordance with the invention separates a switch from a memory capacitor in a memory cell. Another feature is that a combination of diffusion barriers in accordance with the invention substantially completely envelops a memory capacitor, thereby preventing undesired diffusion of chemical species out of the capacitor, and also preventing undesired diffusion of chemical species into the capacitor. This is important for protecting the thin film of metal-oxide dielectric material in a memory capacitor, in particular, for protecting a film of ferroelectric layered superlattice material in a nonvolatile memory capacitor. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, for various layers of the integrated circuit disclosed herein, materials other than those disclosed in preferred embodiments may be employed; thicknesses of the materials disclosed, and alternative materials thereto, other than those disclosed may be used; and material deposition and removal techniques other than those disclosed herein may be used, and all such variations are intended to be included within the scope of the present invention. It is also evident that the steps recited may in some instances be performed in a different order, or equivalent structures and processes may be substituted for the various structures and processes described. Consequently, the invention is to be construed as embracing each and every novel feature and novel combination of features present in and/or possessed by the disclosed compositions and their use in fabrication processes, electronic devices, and electronic device manufacturing methods described. The scope of the invention is indicated by the claims.

The invention claimed is:

1. An integrated circuit, comprising:
a switch;
a capacitor;
an insulator layer located between said switch and said capacitor; and
a conductive oxygen barrier located between said switch and said capacitor;
wherein said conductive oxygen barrier includes a side edge portion and said insulator layer comprises a moat region, said moat region being defined partially by a moat sidewall and a moat bottom, and said moat sidewall including said edge portion of said conductive oxygen barrier.

2. An intergrated circuit as in claim 1 wherein:
said capacitor includes a bottom electrode located on said conductive oxygen barrier; and
a portion of said conductive oxygen barrier is located on said insulator layer.

3. An integrated circuit as in claim 1 wherein said insulator layer comprises an over-etched portion aligned with said conductive oxygen barrier side edge, and wherein said bottom-electrode side edge, said conductive oxygen barrier side edge, and said over-etched portion define said moat sidewall.

4. An integrated circuit as in claim 3 and further including a nonconductive oxygen barrier layer located on said bottom-electrode side edge, said conductive-barrier side edge, and said over-etched portion.

5. An integrated circuit as in claim 1 wherein said capacitor includes a ferroelectric material.

6. An integrated circuit as in claim 5 wherein said ferroelectric material comprises a layered superlattice material.

* * * * *